United States Patent [19]

Yoshino

[11] Patent Number: 4,532,865

[45] Date of Patent: Aug. 6, 1985

[54] ELECTROSTATIC PRINTING METHOD USING HEAT SENSITIVE THERMAL INK TRANSFER

[75] Inventor: Masaki Yoshino, Kanagawa, Japan

[73] Assignee: Fuji Xerox Co., Ltd., Tokyo, Japan

[21] Appl. No.: 516,090

[22] Filed: Jul. 22, 1983

[30] Foreign Application Priority Data

Jul. 22, 1982 [JP] Japan .................. 57-126663

[51] Int. Cl.³ .......................... B41C 1/00
[52] U.S. Cl. .................. 101/426; 400/120;
355/3 CH; 346/76 PH; 430/48; 430/49
[58] Field of Search ........ 101/426, DIG. 13;
400/120; 346/76 PH; 250/317.1, 318; 430/42,
48–49, 348, 31, 351, 902; 355/3 CH, 3 TE, 77

[56] References Cited

U.S. PATENT DOCUMENTS

| | | | |
|---|---|---|---|
| 3,363,555 | 1/1968 | Olden | 101/DIG. 13 |
| 3,717,880 | 2/1973 | Howell | 101/DIG. 13 |
| 3,781,474 | 12/1973 | Rice, Jr. | 101/DIG. 13 |
| 3,845,306 | 10/1974 | Kolmannsperger | 430/348 |
| 3,965,332 | 6/1976 | Thettu | 250/317.1 |
| 4,021,106 | 5/1977 | Gaynor | 101/426 X |
| 4,124,286 | 11/1978 | Barasch | 430/48 |
| 4,255,041 | 3/1981 | Koumura et al. | 101/DIG. 13 |
| 4,399,749 | 8/1983 | Arai | 101/426 X |
| 4,420,268 | 12/1983 | Tsukamura et al. | 400/120 |
| 4,443,093 | 4/1984 | Yoshino et al. | 101/DIG. 13 |

FOREIGN PATENT DOCUMENTS

| | | | |
|---|---|---|---|
| 2461702 | 7/1975 | Fed. Rep. of Germany | 430/42 |
| 112639 | 9/1979 | Japan | 346/76 PH |
| 48204 | 4/1982 | Japan | 430/348 |
| 75898 | 5/1982 | Japan | 430/348 |

Primary Examiner—E. H. Eickholt
Attorney, Agent, or Firm—Sughrue, Mion, Zinn, Macpeak & Seas

[57] ABSTRACT

An electrostatic printing method with which printing is effected using electrical signals representative of picture or image data. A thermal head is driven by the electrical signals so as to transfer heat-sensitive ink in the molten state onto a photo-sensitive sheet from a donor sheet to form a master sheet. The master sheet is then charged, subjected to uniform exposure to form an electrostatic latent image, and then developed using powdered toner. The toner image is transferred onto a printing sheet and fixed thereon to make a copy.

3 Claims, 2 Drawing Figures

ELECTROSTATIC PRINTING METHOD USING HEAT SENSITIVE THERMAL INK TRANSFER

BACKGROUND OF THE INVENTION

The present invention relates to electrostatic printing methods. More particularly, the invention relates to such a method whereby a printing master is formed with heat-sensitive ink in response to electrical signals representative of picture data, and electrostatic printing is carried out with the printing master thus formed using electrographic techniques.

Electrographic printing techniques have been well known in the art for a long time. For instance, a so-called "zero" printing system is disclosed in U.S. Pat. No. 2,576,047, and an electronic printing apparatus shown by Japanese Published Patent Application No. 1,554/1968 employs such a technique.

In the prior art electrostatic photographing methods, a powder image is formed on a photoconductive plate and is fixed thereon, thermally or otherwise, so that the image is formed on the plate as a pattern of nonphotosensitive or insulating material. The plate is then used as a printing master. To carry out printing from this master, the master is uniformly charged and then uniformly exposed to light. As a result, charge is stored in the nonphotosensitive image regions, and not in the photosensitive regions. Charged powder is then allowed to adhere to the plate to thus form a powder image thereon. The powder image is subsequently transferred onto a suitable image supporting element. The above-described operations are cyclically carried out.

The electronic printing apparatus disclosed in the above-mentioned Japanese Published Patent Application No. 1,554/1968 is depicted in FIG. 1. In this figure, reference numeral 1 designates a rotary drum which is provided with holding pawls to hold a photosensitive sheet 10 against the drum 1. A cleaning unit 8, a charging unit 4, a uniform exposure lamp 13, a developing unit 5, a transfer corotron 6 and an infrared fixing unit 7 for fixing toner images on photosensitive sheets 10 are provided around the drum 1.

With this apparatus, a printing master is formed as follows: A photosensitive sheet 10 is caught up onto the drum 1, wound thereon, and held in place with the holding pawls. Then, the sheet 10 is charged by the charging unit 4. Thereafter, an original document positioned on an original stand 3 is illuminated by a lamp 14 to project an image of the original onto the photosensitive sheet 10 through a projecting lens 2, whereby an electrostatic latent image of the original is formed on the sheet 10. The latent image is developed by the developing unit 5. The toner image is thermally fixed to the sheet 10 by the infrared fixing unit 7 to thus form a printing master.

Multiple copies can then be formed from the printing master by electrostatic printing as follows: The printing master having the toner image is charged by the charging unit 4 and uniformly exposed to light by the lamp 13. The photosensitive sheet 10, which was at first uniformly charged, is discharged by the uniform illumination, except for the areas of the image, which are non-photosensitive and nonphotoconductive. Therefore, the thusly formed printing master has a charge pattern corresponding to that of the image. The image is developed by the developing unit 5. A transferring sheet 11 is delivered to a transferring section in synchronization with the rotation of the drum 1, the toner image on the printing master is transferred to the transferring sheet 11 and is fixed thereon by the fixing unit 9. The sheet thus treated is delivered to a sheet discharging tray. Thus, a copy of the toner image is made. Toner remaining on the printing master is removed by the cleaning unit 8. At that point, one printing cycle has been accomplished. The printing cycle is repeatedly carried out as many times as a required number of copies.

Techniques are known, which have been employed in facsimile systems and the like, whereby picture data is converted into electrical signals. Copies can then be produced with a printing device, such as a terminal printer unit, in response to these electrical signals. However, these systems have a drawback in that, if it is desired to make a large number of copies, a considerably long period of time is required since each copy must be printed separately line by line.

An object of the invention is to eliminate the above-described difficulties. More specifically, an object of the invention is to be able to quickly make a number of copies from picture data which has been converted into electrical signals.

SUMMARY OF THE INVENTION

The foregoing object and other objects of the invention have been achieved by the provision of an electrostatic printing method in which, according to the invention, a thermal head is operated according to electrical signals representative of picture data, and heat-sensitive ink in the thermally molten state is transferred onto a photosensitive sheet from a donor sheet to thus form a printing master. With this printing master, charging, uniform exposure, developing and transferring can be repeatedly carried out to make any desired number of copies.

DESCRIPTION OF THE PREFERRED EMBODIMENTS

The method of the invention will be described with reference to FIG. 2 which shows an electrostatic printing machine adapted for practicing the method of the invention. In this apparatus, a thermal head is provided with a number of heat generating electrodes arranged in a line parallel to the axis of rotation of the drum. The apparatus is additionally provided with an optical system for projecting an original image onto a photosensitive sheet.

Figure 1:
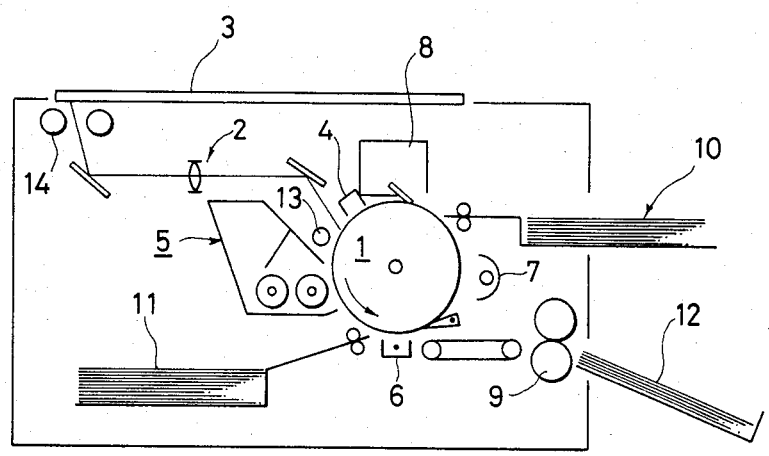
FIG. 1 is a sectional view showing the arrangement of a prior art copier printing apparatus.
Figure 2:
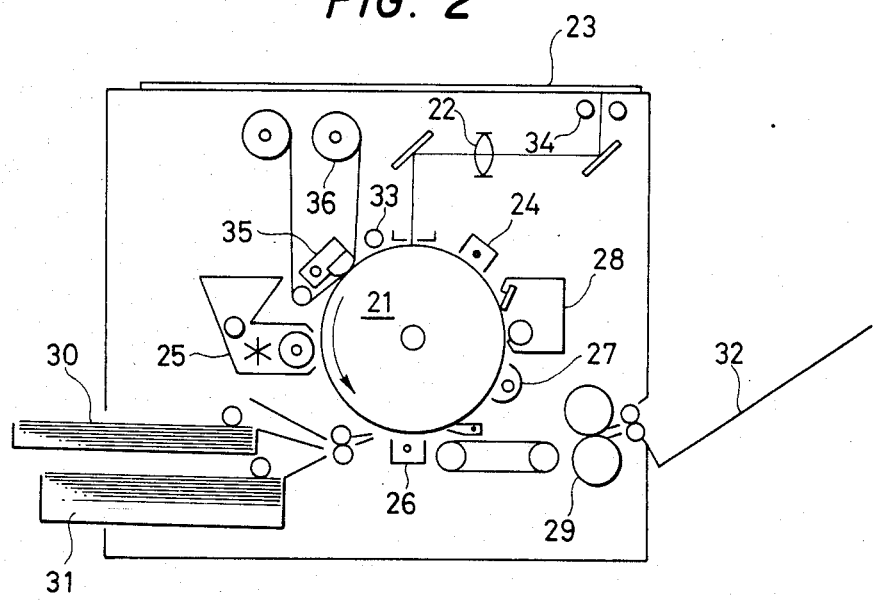
FIG. 2 is a sectional view showing the arrangement of an electrostatic printing apparatus for practicing an electrostatic printing method according to the invention.

Further in FIG. 2, reference numeral 21 designates a rotary drum which has holding pawls to hold a photosensitive sheet 30 against the drum 21. Provided around the drum 21 are a cleaning unit 28, a charging corotron 24, a uniform exposure lamp 33, a thermal head 35, a donor sheet 36, a transferring corotron 26 and a fixing unit 27 for fixing a toner image on the photosensitive sheet 30.

With the apparatus, a printing master is formed as follows: A photosensitive sheet 30 is caught up onto the drum 21, wound thereon, and held in place with the holding pawls. Under this condition, electrical signals representative of the picture data are applied to the thermal head 35, whereupon heat-sensitive ink from the donor sheet 36 is transferred onto the sheet 30 by thermal melting and fusion, thus forming an ink image on the sheet 30.

The heat-sensitive ink is solid at room temperature; however, its state can be reversibly changed into a liquid (fluid) state by heating. Therefore, unheated ink on the donor sheet will not be transferred to the sheet 30. Since the ink is molten at a relatively low temperature, for instance about 100° C., the charging characteristics of the photosensitive sheet 30 will not be adversely affected. Furthermore, the coloring component of the heat-sensitive ink is mostly pigment, which means that the electrical conductivity of the ink itself is low. This is advantageous for the charging characteristic of the photosensitive sheet 30.

An electrostatic printing operation can then be carried out in the same manner as described above to make any desired number of copies from the printing master thus formed; that is, the printing cycle is repeatedly carried out as many times as a desired number of copies. In making copies, it is desirable that the thermal head 35 and the donor sheet 36 be moved away from the surface of the drum 21 so as to prevent wear to the thermal head and damage to the donor sheet web.

A reading section for converting picture data onto electrical signals is not shown in FIG. 2. However, it goes without saying that the printing apparatus should be provided with such a reading section. In this connection, picture data may be applied through a reading unit which is separately provided. With a reading unit, it is possible and useful to subject a multicolor original picture to color separation and picture signal treatment thereby to form printing masters separately according to the color so that multicolor printing can be carried out.

As is clear from the above description, according to the method of the invention, a printing master is formed with heat-sensitive ink from picture data which has been converted into electrical signals, whereby a number of copies can be made quickly.

I claim:

1. An electrostatic printing method comprising the steps of:
    (a) operating a thermal head in accordance with electrical signals representative of image data;
    (b) transferring heat-sensitive ink onto a photosensitive sheet from a donor sheet disposed between said thermal head and said photosensitive sheet to form a master sheet to thereby form ink images representative of said image data;
    (c) charging said master sheet;
    (d) uniformly exposing said master sheet to form an electrostatic latent image on said ink images;
    (e) developing said latent image into a toner image with powdered toner;
    (f) transferring said toner image to a recording sheet; and
    (g) fixing said toner image on said recording sheet.

2. The electrostatic printing method of claim 1, further comprising the steps of repeating said steps (c) to (g) a number of times corresponding to a desired number of copies.

3. The method of claim 1, wherein said steps (a) to (g) are carried out a plurality of times, one time for each color of a multicolor original image.

* * * * *